(12) United States Patent
Ono

(10) Patent No.: US 6,261,889 B1
(45) Date of Patent: Jul. 17, 2001

(54) MANUFACTURING METHOD OF SEMICONDUCTOR DEVICE

(75) Inventor: Atsuki Ono, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/525,904

(22) Filed: Mar. 15, 2000

(30) Foreign Application Priority Data

Mar. 16, 1999 (JP) .................................................. 11-070723

(51) Int. Cl.[7] .............................................. H01L 21/8238
(52) U.S. Cl. ...................... 438/232; 438/305; 438/306; 438/307; 438/516; 438/530
(58) Field of Search ..................... 438/199, 229, 438/232, 299, 305, 306, 307, 515, 516, 530

(56) References Cited

U.S. PATENT DOCUMENTS 5,571,734 * 11/1996 Tseng et al. .
5,712,208 * 1/1998 Tseng et al. ......................... 438/770
6,017,784 * 6/2000 Mehta et al. ......................... 438/303

FOREIGN PATENT DOCUMENTS

| 908947 | * 4/1999 | (EP) . |
| 5-251463 | 9/1993 | (JP) . |
| 8-330441 | 12/1996 | (JP) . |

* cited by examiner

*Primary Examiner*—Long Pham
(74) *Attorney, Agent, or Firm*—McGinn & Gibb, PLLC

(57) ABSTRACT

After a source-drain region is formed, fluorine 24 is ion-implanted into the entire surface of a substrate and thereafter a heat treatment is conducted, for example, at 600 to 800° C. Through this heat treatment, the dangling binds and the Si—H bonds in the channel regions 26 are substituted by the Si—F bonds, which prevents the generation of the negative bias temperature instability effect in a MOSFET.

12 Claims, 10 Drawing Sheets

(a)

(b)

△ NO.1 (present invention)
○ NO.2 (present invention)
◇ NO.3 (present invention)
□ NO.4 (prior art)

○ NO.1 (present invention)
◇ NO.2 (prior art : without SiN film)
□ NO.3 (prior art : with SiN film)

MANUFACTURING METHOD OF SEMICONDUCTOR DEVICE

BACKGROUND OF THE INVENTION

1. Field of the Invention

The present invention relates to a manufacturing method of a MOS (Metal-Oxide-Semiconductor) transistor, and more particularly, to a technique to improve transistor characteristics in such a way that, in a p-channel MOS transistor (referred to as pMOS, hereinafter), the change in the threshold voltage and the lowering of the drain saturation current that may occur in long-term use (negative bias temperature instability) are prevented, and, in an n-channel MOS transistor (referred to as nMOS, hereinafter), the change in the threshold voltage due to the hot electron effect is suppressed.

2. Description of the Related Art

For the generation of semiconductor devices of which, with miniaturization proceeding, the design rule is reduced to the order of deep-submicron or less, a surface channel type structure is the one that is generally employed for a pMOS with the object of controlling the short channel effect. To obtain this surface channel type structure, it is necessary to form a source-drain region with a shallow junction. For the purpose of achieving this shallow junction, then, a technique in which, instead of $B^+$, $BF_2^+$ is utilized as an ion species in forming the source-drain region has been, hitherto, in wide use. Since $BF_2^+$ has a larger mass than $B^+$, the range thereof can be made smaller and, consequently, a shallow junction can be attained.

When $BF_2^+$ is used, however, a phenomenon called the boron penetration is known to cause a serious problem. In a manufacturing method of a MOS transistor, both the implantation of dopants into a gate electrode and the implantation of dopants into a source-drain region are normally carried out in one common step so as to minimize the number of steps therein. In this instance, it is $BF_2^+$ that is doped into the gate electrode. The presence of fluorine, however, causes diffusion of boron within the gate electrode to be accelerated, in the step of a heat treatment for forming the source-drain region and the like so that some atoms of boron may become caught in a gate oxide film and some other atoms, penetrating through the gate oxide film, may diffuse into a silicon substrate. Once this boron diffusion occurs, the reliability of the gate oxide film is lowered, with the threshold voltage of the transistor rising and with the breakdown voltage thereof dropping and so forth. The problem of this sort arises notably in the case that the ion implantation with $BF_2^+$ which simultaneously introduces F and B is carried out. When $B^+$, instead of $BF_2^+$, is used for the ion implantation, F cannot be caught in the gate electrode together with B. Consequently, even if diffusion of B takes place, B does not come to penetrate through the gate oxide film and, therefore, the problem as described above is hardly ever brought about.

Meanwhile, recent various improvements on the ion implantation system have enabled the ion implantation to be conducted at a low acceleration voltage and, under the current conditions, it is possible to form a shallow junction even by the implantation with boron. Therefore, with some additional considerations, such as setting the acceleration voltage low, given to the ion implantation method, the use of the implantation with boron can achieve both the formation of a shallow junction in a source-drain region and the solution of the problem of boron penetration.

Further, a technique in which both $B^+$ and $F^+$ are doped into a source-drain region while only $B^+$ is doped into a gate electrode has been also developed. In Japanese Patent Application Laid-open No. 330441/1996, there is disclosed another method wherein $F^+$-ions are first implanted into a source-drain region and thereafter the entire surface is subjected to the ion implantation of boron. It is considered that, also by such a method, the prevention of the boron penetration, together with the formation of a shallow junction can be attained, since no fluorine is doped into a gate electrode.

As described above, in a manufacturing process in which not $BF_2^+$ but $B^+$ is implanted into a gate electrode, the boron penetration can be well suppressed. With such a process, however, the following problems that have not been recognized so far arise.

While the region directly under a gate insulating film functions as a channel region of the transistor, terminal sections of silicon constituting this channel region are, in form, either remaining unbound (the dangling bond) or bonded to a hydrogen atom, as shown in FIG. 5(a). Because the dangling bond traps the carrier and lowers the capability of the channel region to function, the dangling bonds therein are normally eliminated, in the prior art, by carrying out the hydrogen termination through a treatment of hydrogen annealing and generating the Si—H bonds. Since the bond energy of Si—H is relatively low, however, hydrogen is liable to dissociate from the bonding in course of time, resulting in generation of the dangling bond once more. As the dangling bonds increase like this, in course of time, through the use of the transistor, the degree of carrier trapping in the channel region also increases in course of time (This phenomenon is referred to as the negative bias temperature instability effect (slow trap effect), hereinafter). Once the negative bias temperature instability effect is generated, there arises a problem that the threshold voltage changes in course of time and, along with that, the drain saturation current decreases in course of time.

Such a problem resulting from generation of the negative bias temperature instability effect has not been, up to now, recognized fully or techniques to solve this problem have been hardly studied. The present invention is made to overcome problems of this sort and its immediate object is to suppress generation of the negative bias temperature instability effect and prevent the change in threshold voltage and the decrease in drain saturation current.

Further, another object of the present invention is to overcome the problem of deterioration of element characteristics that arise due to the hot electron effect. The hot electron effect is a phenomenon in which high energy electrons produced by being accelerated by the electric field between source and drain together with electrons and holes produced by the impact ionization intrude into a gate oxide film and thereby alters the MOS characteristics. In a conventional MOSFET (MOS Field Effect Transistor), silicon in a channel region has the terminal structure of Si—H with a weak bonding strength so that, in operating the transistor, channel carriers are liable to collide with and break the Si—H bonds. Such breaking of the Si—H bonds leads to the generation of an interface state, which then brings about the hot electron effect. The hot electron effect causes the threshold voltage to change and the mutual conductance $g_m$ to degrade and, thus, reduces the reliability of the element greatly. This problem is particularly pronounced in the nMOS, because a larger drain saturation current flows in the nMOS than the one in the pMOS. Further, the hot electron effect becomes more marked when the gate length becomes shortened through the element miniaturization, or a high electron field becomes applied between source and drain. It is another object of the present invention that such a problem is solved and the change in the threshold voltage as well as the degradation of the mutual conductance $g_m$ that occur due to the hot electron effect are prevented with effect.

Further, although both the suppression of the negative bias temperature instability effect and the suppression of the hot electron effect cause the same effect of preventing the change in the threshold voltage, these are essentially different issues. The change in the threshold voltage due to the negative bias temperature instability effect is brought about by gradual breaking of the Si—H bonds in a channel region and generating the dangling bonds in course of time and is an issue concerning an improvement on the long term reliability of the transistor. On the other hand, the change in the threshold voltage due to the hot electron effect is brought about through intrusion into a gate oxide film by hot electrons which are generated when the transistor is in use. In short, they are separate issues originated through different mechanisms at different places.

As described above, the present invention aims to solve the first problem that the change in the threshold voltage and the decrease in the drain saturation current due to the generation of the negative bias temperature instability effect should be prevented, and further to solve the second problem that, by suppressing the hot electron effect, the change in the threshold voltage and the degradation of the mutual conductance $g_m$ should be prevented. Especially when the present invention is applied to a pMOS, the primary object is to solve the problem of the negative bias temperature instability effect and when applied to an nMOS, the problem of the hot electron effect. The explanation lies in the fact that, in a pMOS, ON-current is considerably small so that the problem of hot electrons occur relatively infrequently and the problem of the negative bias temperature instability effect becomes more important, while in an nMOS, in contrast with that, the problem of hot electrons becomes more important. In a pMOS, negative bias is applied on a gate electrode. Therefore holes which can generate dangling bonds are introduced to the region under the gate electrode and the problem of the negative bias temperature instability effect becomes more important in a pMOS.

SUMMARY OF THE INVENTION

The present inventors conceived a novel idea to use, against the above problems, a technique in which, with fluorine being doped, the silicon terminals in a channel region is made substituted by the Si—F bonds and, recognizing its effectiveness, brought the idea to completion as the present invention, successfully.

In light of the above problems, the present invention provides a method of manufacturing a semiconductor device; which comprises the steps of:

forming a gate electrode over a gate insulating film on a silicon substrate;

introducing dopants of a given conductive-type into said gate electrode and the surface of said silicon substrate;

carrying out a first heat treatment so as to make said dopants within said silicon substrate diffuse and form a source-drain region;

doping fluorine, at least, into said gate electrode and thereafter carrying out a second heat treatment.

Further, the present invention provides a method of manufacturing a semiconductor device; which comprises the steps of:

forming a gate electrode over a gate insulating film on a silicon substrate;

introducing dopants of a given conductive-type into said gate electrode and the surface of said silicon substrate;

carrying out a first heat treatment so as to make said dopants within said silicon substrate diffuse and form a source-drain region;

forming a silicon nitride film over the entire surface;

doping fluorine, at least, into said gate electrode and thereafter carrying out a second heat treatment.

In a manufacturing method of a semiconductor device according to the present invention, after fluorine is doped, at least, into a gate electrode, a second heat treatment makes fluorine within the gate electrode diffuse and diffused fluorine bond to silicon in a region located directly under a gate insulating film. By this, the Si—H bonds and the dangling bonds shown in FIG. 5(a) are efficiently replaced with fluorine atoms to form the Si—F bonds as shown in FIG. 5(b). Since the Si—F bonds have a higher bond energy than the Si—H bonds, the phenomenon that these bonds are gradually broken in course of time and the dangling bonds are made to increase hardly ever takes place. Consequently, the negative bias temperature instability effect hardly ever generates so that the change in the threshold voltage and the decrease in drain saturation current can be prevented with effect. Further, the Si—F bonds have higher bond energy than the Si—H bonds, this method is also effective to suppress the hot electron effect. In a conventional MOSFET, breaking of the Si—H bond terminals makes an interface state generate, and, therefore, the degradation of element characteristics due to the hot electron effect is liable to happen. Against this, in the present invention, because the Si—H bonds and the dangling bonds are substituted by the Si—F bonds, such problems can be overcome with effect.

In the present invention, after a source-drain region is formed, doping of fluorine is carried out. If the order of the steps is reversed and a source-drain region is formed after doping of fluorine is carried out, not only the effects of suppressing the negative bias temperature instability effect or the like cannot be sufficiently obtained but also the problem of the more marked boron penetration may arise.

For example, in a pMOS for which $BF_2^+$ or $B^+$ is utilized as dopants in a source-drain region, if fluorine is doped into a gate electrode before these ions are implanted thereinto, the problem of boron penetration becomes serious. On this occasion, after doping fluorine, a heat treatment is conducted for the purpose of forming the source-drain region or the like. If this heat treatment is carried out under the conditions optimum to forming the source-drain as well as eliminating the gate depletion in a gate electrode of the surface channel type, the conditions being at a high temperature in the presence of fluorine, the boron penetration is apt to become considerable. For example, in a conventional method of manufacturing a pMOS, a process in which, after $BF_2^+$ is ion-implanted over the entire surface, a source-drain region is formed by activating the dopants by a heat treatment, is widely used. In this process, the heat treatment for formation of the source-drain region is conducted in the presence of fluorine. As described above, fluorine accelerates the diffusion of boron (Japanese Patent Application Laid-open No. 330441/1996 and so forth) so that, by the above heat treatment, boron in the gate electrode is made to diffuse with a high diffusion velocity and penetrate through a gate oxide film and further diffuse into a silicon substrate.

Further, in an nMOS, if a source-drain region is formed after doping fluorine, the diffusion depth of dopants may change and the source-drain region formed may not have a prescribed depth. As the diffusion velocity of dopants is altered in the presence of fluorine, if fluorine in a gate oxide film diffuses into a silicon substrate, this fluorine may accelerate this diffusion of implanted dopants in the source-drain region and may alter the diffusion depth. Especially when doping of fluorine is applied to the entire surface of the substrate, the problem becomes considerable.

Further, when the source-drain region is formed after doping fluorine, the effects of the present invention such as suppressing the negative bias temperature instability effect cannot necessarily be obtained to the full, and, on some occasions, even element characteristics may deteriorate. When fluorine is doped in advance, a heat treatment for forming the source-drain must be carried out after doping fluorine. In this instance, if the heat treatment is conducted under the conditions favourable to form the source-drain, fluorine that is once doped in may gasify and emit from the substrate as well as the gate electrode to the outside, and, in other words, so-called out-diffusion is liable to happen. This reduces the amount of remaining fluorine within the gate electrode and the formation o the Si—F bonds may become insufficient. In recent years, rapid annealing at a high temperature such as RTA (Rapid Thermal Annealing) or the like is widely utilized as an annealing method for the formation of the source-drain, from the point of view of improving the process efficiency. The use of such a heat treatment method makes out-diffusion particularly pronounced and reduces the amount of fluorine remaining in the gate electrode.

Further, in the case that doping of fluorine is carried out in advance, there are some occasions on which the proportion of fluorine atoms that do not contribute to the generation of the Si—F bonds increases and, as a result, the effect of suppressing the negative bias temperature instability effect or the like cannot be obtained sufficiently and, furthermore, even degradation of element characteristics may be brought about. While substitution of the Si—H bonds and the dangling bonds to the Si—F bonds is made by carrying out a heat treatment after doping fluorine, the extent of the proceeding of this substitution reaction is determined by a balance between the diffusion of fluorine and the generation of the Si—F bonds. Therefore, the heat treatment for forming the Si—F bonds is preferably made under the optimum conditions, depending on the amount of doped fluorine and other conditions. Yet, when the heat treatment for forming the source-drain is performed after doping fluorine, it is the conditions for this heat treatment that determine a balance between the diffusion of fluorine and the generation of the Si—F bonds. Since the heat treatment for forming the source-drain is, in general, performed at a high temperature, the diffusion of fluorine takes precedence over the generation of the Si—F bonds and, as a result, the proportion of fluorine atoms that do not contribute to the generation of the Si—F bonds tends to increase. If this happens, the generation rate of the Si—F bonds decreases and the effects of the present invention cannot be obtained to the full, and, on some occasions, even the element characteristics may deteriorate because of the diffusion of unbound fluorine atoms that takes place in the later steps. For example, thermal diffusion of unbound fluorine atoms may take place in a silicon substrate or in an interlayer insulating film that is to be formed in a later step and result in the degradation of the transistor characteristics. There are also cases in which some of unbound fluorine atoms remain in a gate electrode and cause the boron penetration not only in the step of the heat treatment for forming the source-drain but also in the later step of another heat treatment. Accordingly, in the present invention, a second heat treatment is performed so as to prevent unbound fluorine atoms from remaining.

The above points considered, in the present invention, the fluorine doping is carried out after the formation of a source-drain region.

Meanwhile, with respect to the fluorine doping, though it is to be carried out before the formation of a source-drain region, there has been reported another example for which investigations were made for a purpose other than the one the present invention has. In Japanese Patent Application Laid-open No. 251463/1993, there is described a method of manufacturing a FET with a LDD (Lightly Doped Drain) structure wherein fluorine is doped into a gate oxide film prior to the formation of a sidewall. In forming the LDD structure, ion implantation for the formation of the LDD is first carried out, and thereafter a sidewall is formed and, then, using this sidewall as a mask, another ion implantation for the formation of a source-drain region is performed. In short, the above method is the one in which the source-drain region is formed after the fluorine doping. By performing the fluorine doping in this order, the art disclosed in the above publication sought to achieve suppressing the change in threshold voltage and the decrease in carrier mobility at the time of carrier injection. In other words, the change in the threshold voltage which is brought about by injection of hot carriers into a gate oxide film is suppressed through formation of the Si—F bonds in the gate oxide film in advance. When the fluorine doping is carried out in this order, however, the heat treatment for forming the source-drain is conducted in a state where fluorine is present within the gate oxide film so that the boron penetration tends to become considerable. Further, out-diffusion of fluorine also becomes pronounced and, moreover, because the diffusion of fluorine takes precedence over the generation of the Si—F bonds, the Si—F bonds are not necessarily formed to the full in the channel region and, therefore, there cannot be obtained sufficient effects of suppressing the negative bias temperature instability effect or the like, which is the very object of the present invention.

As described above, manufacturing processes in which the fluorine doping is performed for a purpose other than the suppression of the negative bias temperature instability effect have been investigated before, although in these processes, the fluorine doping is performed before the formation of a source-drain region. The problem of the negative bias temperature instability effect has been hardly ever recognized and, consequently, measures to overcome this problem have not been much studied. With investigations conducted by the present inventors, it was established that such a problem can be solved effectively by performing the fluorine doping and, at the same time, arranging that this fluorine doping is carried out after forming a source-drain region. The present invention is brought to completion on the basis of such an understanding.

The fluorine doping in the present invention is preferably carried out after a source-drain region is formed and then a silicon nitride film is also formed over the entire surface. With a silicon nitride film being formed, the out-diffusion of fluorine can be prevented and, thus, the Si—F bonds can be formed sufficiently. Further, as the rate of fluorine atoms remaining in a gate electrode or a substrate increases, the amount of fluorine to be doped can be reduced to the required minimum which is a clear advantage upon setting the steps of a manufacturing process. In a manufacturing process wherein a silicon nitride film is not formed, a considerable amount of fluorine must be introduced, because there are always more than a certain proportion of the doped fluorine atoms that do not contribute to the generation of the Si—F bonds. When a large amount of fluorine is doped, however, unless annealing is sufficiently carried out, there are occasions on which fluorine gas is confined within an upper layer such as an interlayer insulating film or its interface, causing a film to swell or peel off. Because of this, it is necessary to set an annealing time considerably long so as to gasify superfluous fluorine thoroughly to remove. This may result in lowering the process efficiency. Further, there are even cases in which it becomes difficult to control the remaining fluorine properly. In contrast with this, if the fluorine doping is carried out after forming a silicon nitride film, the process efficiency can be raised and besides, the degradation of element characteristics due to the fluorine diffusion that may occur in the later steps can be prevented. Further, this silicon nitride film can serve as an etching stopper film in the later steps of forming a contact hole and thereby can prevent the leakage of current, which is another advantage.

DETAILED DESCRIPTION OF THE PREFERRED EMBODIMENTS

Figure 1:
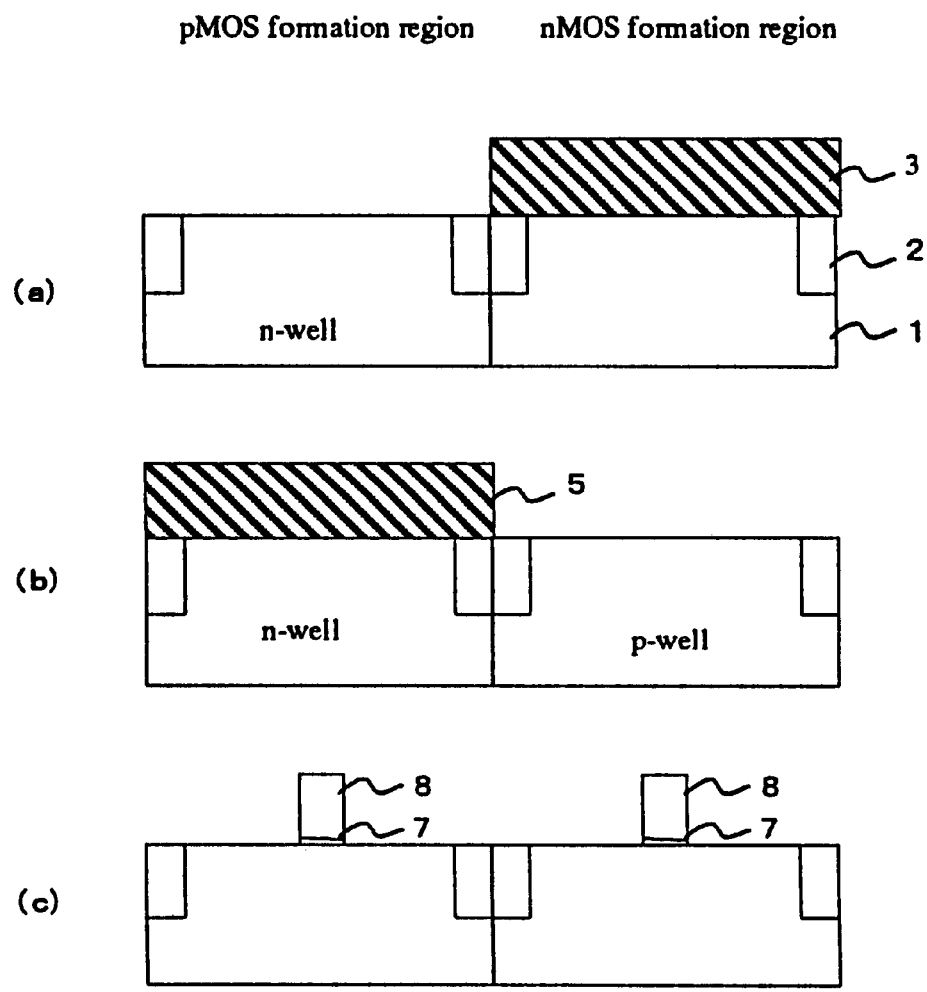
FIGS. 1(a)–1(c) are a series of schematic cross-sectional views illustrating the steps of a method of manufacturing a semiconductor device in accordance with the present invention.

In a manufacturing method of a semiconductor device according to the present invention, a gate electrode is first formed over a gate insulating film on a silicon substrate. For the gate insulating film, for example, a silicon thermal oxide film is utilized. The gate electrode is made of polysilicon, a refractory metal or the like, or alternatively multi-layered in structure using these materials together. As for the method of forming a gate electrode, there is no specific limitation and, for example, a method in which a gate insulating film and a gate electrode layer are formed, and thereafter patterning is carried out by selective etching is employed.

Next, dopants of a given conductive-type are introduced into the gate electrode and the surface of the silicon substrate. With respect to the silicon substrate, dopants are normally introduced into the regions on both sides of the gate electrode. The doping is carried out, for example, by the ion implantation method. As described above, by introducing dopants both into the gate electrode and into the silicon substrate in one and the same step, the process efficiency can be raised.

Next, a first heat treatment is performed. While this heat treatment makes the dopants in the silicon substrate diffuse and forms a source-drain region, normally, this treatment concurrently activates the dopants in the gate electrode so as to improve a conductivity of the gate electrode. The conditions for the first heat treatment are appropriately set, depending on the doping conditions and so forth. For example, when the doping is carried out by the ion implantation method, the conditions for this heat treatment are determined, according to the implantation species, the acceleration voltage, the dose and the like. Further, if the heat treatment mentioned above is performed by the RTA, the dopants can be activated within a short time and adverse effects on the dopant distribution in the dopant diffusion layer or on the elements disposed on the substrate can be well controlled. Especially when a shallow diffusion layer is formed, the heat treatment by the RTA is effective. To use the RTA, the treatment temperature is normally set to be 900 to 1100° C.

Next, if required, after a silicon nitride film is formed, fluorine is doped, at least, into the gate electrode and, then, a second heat treatment is carried out. With regard to the fluorine doping, various methods, including the ion implantation method and the thermal diffusion method can be utilized, and, further, considering the process efficiency, the entire surface of the substrate, instead of the gate electrode alone, can be subjected to the doping. When the ion implantation method is used, the dose is preferably $1 \times 10^{13}$ cm$^{-2}$–$1 \times 10^{16}$ cm$^{-2}$, and more preferably $5 \times 10^{14}$ cm$^{-2}$–$3 \times 10^{15}$ cm$^{-2}$. The acceleration voltage is preferably 5–30 keV and more preferably 5–20 keV. With such conditions of the ion implantation taken, the fluorine can be doped sufficiently without giving any damage to the substrate.

In the case that the doping is made by the thermal diffusion method, a method in which a heat treatment is conducted in a gas containing fluorine such as $NF_3$ or the like is used, for example. The temperature for the heat treatment is, for example, 700–950° C. and preferably 750 to 900° C. If the temperature for the heat treatment is set too high, the dopant distribution in the source-drain region may be affected and, in the pMOS, even the boron penetration may take place. On the other hand, if the temperature for the heat treatment is set too low, fluorine may not be sufficiently doped thereinto.

The second heat treatment after the fluorine doping is performed in order that fluorine may diffuse and migrate into a region of the gate insulating film so as to substitute the terminal sections of silicon in that region to the Si—F bonds efficiently. The treatment temperature for the second heat treatment is preferably 500 to 900° C. and more preferably 600 to 800° C. If the temperature for the heat treatment is set too high, the out-diffusion of fluorine may become pronounced or the diffusion of fluorine may take precedence over the generation of the Si—F bonds, resulting in the insufficient formation of the Si—F bonds. In addition, the boron penetration may take place and, further, the dopant concentration profile in the source-drain region may be changed. On the other hand, if the temperature for the heat treatment is set too low, fluorine may not be introduced thereinto sufficiently. When the second heat treatment is carried out in the above temperature range, the fluorine atoms introduced thereinto substitute efficiently the Si—H bonds and the dangling bonds of silicon that constitute the channel region or the like to form the Si—F bonds so that the negative bias temperature instability effect and the hot electron effect can be suppressed still more effectively. Further, the proportion of the fluorine atoms that do not contribute the bonding can be reduced and, therefore, the degradation of the element characteristics that is caused by fluorine of that sort can be well suppressed.

In the present invention, if a silicon nitride film is formed prior to the doping of fluorine, it is preferable to form the film by the LP (Low-Pressure) CVD method. Using this method, the dense nature of the film can be improved further so that the out-diffusion of fluorine can be prevented with effect. As for the conditions of the film formation, preferably, the temperature is set to be 600 to 750° C. and the growth time, 1–7 hours. Under these conditions, the dense nature of the film can be improved still further.

The present invention is particularly effective when applied to a MOSFET whose gate electrode has a width of 0.2 μm or less or a MOSFET whose gate insulating film has a thickness of 4 nm or less, since the change in the threshold voltage due to the negative bias temperature instability effect or the hot electron effect exerts a large influence upon these FETs with advanced miniaturization.

When the present invention is applied to a pMOS, especially to a pMOS of the surface channel type having a p-type electrode, the problem of the negative bias temperature instability effect can be solved very much with effect. The explanation lies in the fact that the drain saturation current in the pMOS is small in comparison with that in the nMOS, and, consequently, the effect of the negative bias temperature instability effect therein tends to become considerable. Especially in the pMOS of the surface channel type, in addition to that, the channel region is narrow so that the effect of the negative bias temperature instability effect becomes still more marked. Accordingly, the present invention can solve the problem of the negative bias temperature instability effect still more effectively in case boron is utilized as dopants and, moreover, in case it is applied to a manufacturing process wherein a source-drain region with a shallow junction is formed by the ion implantation method with an acceleration voltage of 8 keV or less.

Further, when the present invention is applied to an nMOS, the problem of the hot electron effect rather than that for suppressing the negative bias temperature instability effect can be solved with effect. This results from the fact that in the nMOS, the drain saturation current is large in comparison with that in the pMOS so that the hot electron effect becomes more significant. On this occasion, arsenic, phosphorus, antimony or the like is utilized as dopants in the source-drain region.

FIRST EXAMPLE

The present example illustrates a case in which the present invention is applied to a process of manufacturing a CMOS (Complementary MOS). Referring to FIGS. 1–4, the present Example is described below.

First, as shown in FIG. 1(a), after element isolation films 2 were formed on a silicon substrate 1 by means of STI (Shallow Trench Isolation), a resist mask 3 was formed in an nMOS formation region and, then, phosphorus was ion-implanted into a pMOS formation region, and thereby an n-type well 4 was formed. Subsequently, with the resist mask 3 being left as it was, arsenic was injected as channel dopants in order to adjust the threshold voltage. The conditions of the ion implantation were that the acceleration voltage was 100 keV and the dose was $7 \times 10^{12}$ cm$^{-2}$.

Next, as shown in FIG. 1(b), a resist mask 5 was set in the pMOS formation region and, then, boron was ion-implanted into the nMOS formation region, and thereby a p-type well 6 was formed. Subsequently, with the resist mask 5 being left as it was, boron was injected as channel dopants in order to adjust the threshold voltage. The conditions of the ion implantation were that the acceleration voltage was 30 keV and the dose was $8 \times 10^{12}$ cm$^{-2}$.

Following this, by carrying out the pyrogenic oxidation at 850° C., a gate oxide film 7 with a thickness of 4 nm was formed on the surface of the active region and thereafter a polysilicon film 8 was deposited thereon to a thickness of 150 nm. These two films were then patterned by selective etching (FIG. 1(c)). The gate length for respective gate electrodes was set to be 0.18 μm.

Next, as shown in FIG. 2(a), a resist mask 12 was set in the nMOS formation region and the ion implantation was applied to the pMOS formation region, and thereby a source-drain extension region 13 being doped to a high concentration was formed. The ion species, hereat, was BF$_2$, the acceleration voltage was 5 keV and the dose was $1 \times 10^{14}$ cm$^{-2}$. Next, with the resist mask 12 being left as it was, ion implantation for forming a pocket region 14 was performed. This ion implantation was conducted by the rotational implantation method at an injection angle of 25°. Arsenic was utilized as the ion species and the acceleration voltage was set to be 70 keV and the dose, $2 \times 10^{13}$ cm$^{-2}$.

Next, as shown in FIG. 2(b), a resist mask 15 was set in the pMOS formation region and the ion implantation was applied to the nMOS formation region, and thereby a source-drain extension region 16 being doped to a high concentration was formed. The ion species, hereat, was arsenic, the acceleration voltage was 10 keV and the dose was $4 \times 10^{14}$ cm$^{-2}$. Next, with the resist mask 15 being left as it was, ion implantation for forming a pocket region 17 was performed. This ion implantation was conducted by the rotational implantation method at an injection angle of 25°. BF$_2$ was utilized as the ion species and the acceleration voltage was set to be 30 keV and the dose, $4 \times 10^{13}$ cm$^{-2}$.

Next, a sidewall 18 as well as a sidewall 19 was formed by a well-known conventional method, accomplishing a gate electrode 20 as well as a gate electrode 21 (FIG. 2(c)). Subsequently, boron was ion-implanted into the pMOS formation region. Through this, the formation of a source-drain region 22 and the doping into the gate electrode 20 were simultaneously achieved (FIG. 2(d)). The conditions for the boron implantation were that the acceleration voltage was 5 keV and the dose was $4 \times 10^{15}$ cm$^{-2}$.

Subsequently, arsenic was ion-implanted into the nMOS formation region. Through this, the formation of a source-drain region 23 and the doping into the gate electrode 21 were simultaneously achieved (FIG. 2(d)). The conditions for the implantation were that the acceleration voltage was 50 keV and the dose was $6\times10^{15}$ cm$^{-2}$. After this, in a nitrogen atmosphere, a RTA treatment was conducted at 1050° C. for 10 seconds and the dopants within the source-drain regions and the gate electrodes were activated. FIG. 2(d) represents the state after the steps thus far have been completed.

Figure 5:
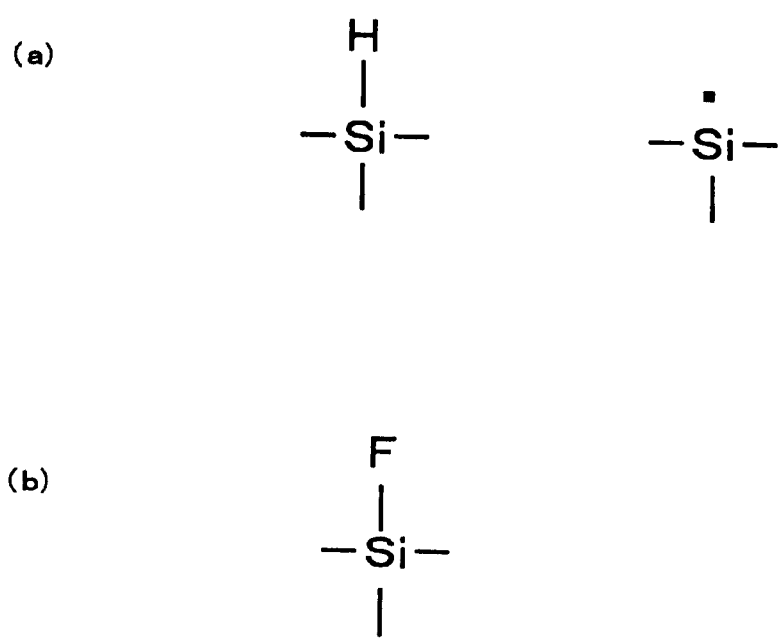
FIGS. 5(a) and 5(b) are a pair of views in explaining the structure of the terminal section of silicon.

Next, as shown in FIG. 3(a), the entire surface was subjected to the ion implantation of fluorine 24. The implantation conditions were that the acceleration voltage was 10 keV and the dose was $3\times10^{15}$ cm$^{-2}$. When the ion implantation was performed under these conditions, the range of fluorine stayed in the gate electrodes and the vicinity of the surface of the silicon substrate. After the doping of fluorine, as shown in FIG. 3(b), in a nitrogen atmosphere, a heat treatment was conducted at 700° C. for 20 minutes. By this, fluorine in the gate electrodes reached the channel regions 26 lying directly under the gate insulating film 7 through thermal diffusion. The terminal section of silicon constituting the channel regions 26 was, in form, as shown in FIG. 5(a), either bonded to a hydrogen atom or remaining unbound, but, in either case, it was readily replaced with a fluorine atom to take the form shown in FIG. 5(b). That is, the Si—H bonds and the dangling bonds of silicon constituting the channel regions 26 were substituted by fluorine atoms efficiently.

Subsequently, after a cobalt film was formed by the sputtering method, cobalt silicide 27 was formed by applying a heat treatment (FIG. 4(a)). Cobalt silicide 27 was formed, as shown in the drawing, on the gate electrodes and on the source-drain regions. The film thickness of cobalt silicide 27 was approximately 35 nm.

Next, after a BPSG (Boro-Phospho Silicate Glass) film 28 was formed over the entire surface as an interlayer insulating film, contact holes were set and then tungsten plugs 29 were formed by means of well-known CMP (Chemical Mechanical Polishing) (FIG. 4(b)). After that, upper layer interconnections and the like were formed by a well-known method, and thereby a CMOS was accomplished.

For a pMOS included in a CMOS that was manufactured in the above method, an evaluation of characteristics of the negative bias temperature instability effect resistance was made. In addition, other pMOSs which were manufactured in the same way as the above but with altered amounts of the fluorine doping were also evaluated. The amounts of the fluorine doping for respective samples are summarized in Table 1. The pMOS described in the above Example is Sample No. 2. Sample No. 4 is a conventional pMOS into which no fluorine was doped.

TABLE 1

| NO. | Dose of the fluorine doping (cm$^{-3}$) | Acceleration voltage at the time of fluorine doping (keV) |
| --- | --- | --- |
| 1 | $6 \times 10^{15}$ | 10 |
| 2 | $3 \times 10^{15}$ | 10 |
| 3 | $5 \times 10^{14}$ | 10 |
| 4 | None | — |

Figure 6:
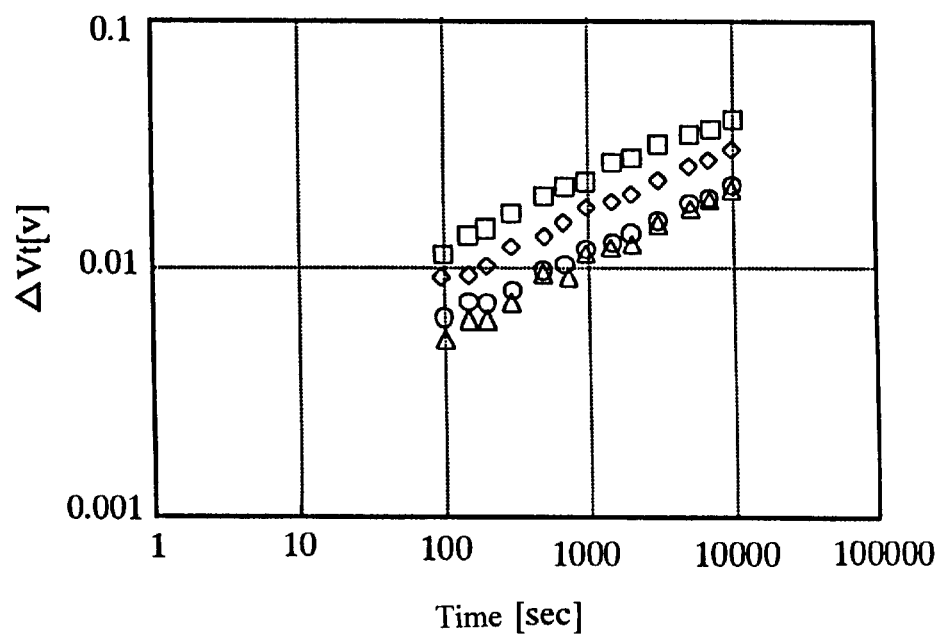
FIG. 6 is a graph in explaining the effect of the negative bias temperature instability effect improvement obtained under the application of the present invention.

The evaluation was made by measuring changes in the threshold voltage while samples were left in an atmosphere at 200° C. When left at such a high temperature, dangling bonds are liable to be generated within the gate insulating film and the channel regions. When this happens, the generation of the negative bias temperature instability effect is accelerated and the change in the threshold voltage, increased. In other words, the evaluation method of the present Example corresponds to an accelerated test of characteristics of the negative bias temperature instability effect resistance. The evaluation results are set out in FIG. 6. It is clearly seen that Samples Nos. 1–3 manufactured by the method of the present invention show a smaller change in the threshold voltage ($\Delta V_{th}$) than Sample No. 4 of a conventional method, which indicates the negative bias temperature instability effect was well suppressed in Samples Nos. 1–3.

The above description shows that the present Example can improve characteristics of the negative bias temperature instability effect resistance in the pMOS of the CMOS. For the nMOS, the present Example also has the effect of suppressing the change in the threshold voltage due to hot electrons, though not shown.

SECOND EXAMPLE

A CMOS was manufactured in the same way as First Example (Sample No. 2) except that the ion implantation of fluorine was carried out after a silicon nitride film was formed and that the heat treatment after the fluorine doping was not performed. Referring to the drawings, a manufacturing process of the present example is described below.

Figure 2:
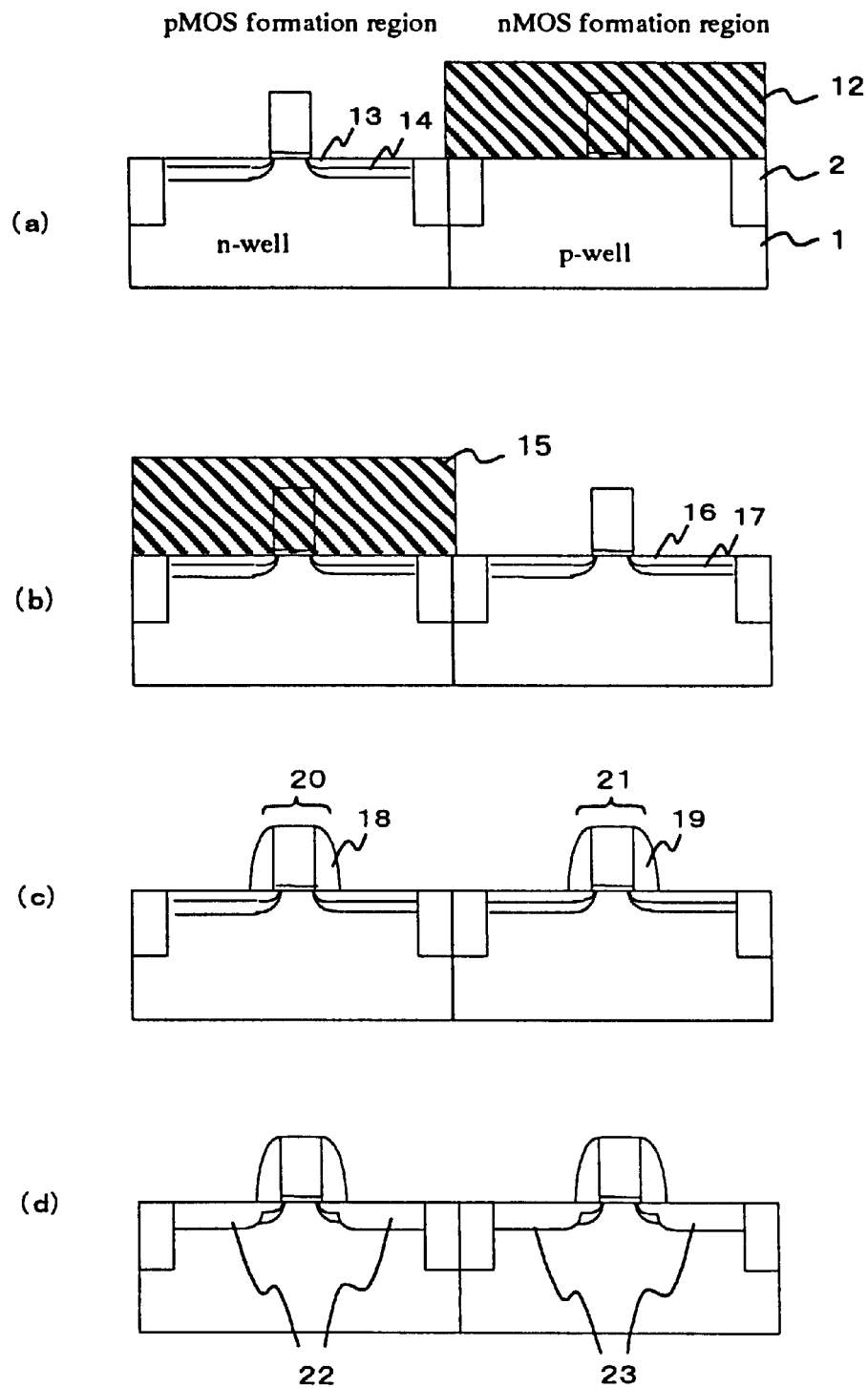
FIGS. 2(a)–2(d) are a series of schematic cross-sectional views illustrating further steps of the method of manufacturing a semiconductor device in accordance with the present invention.
Figure 3:
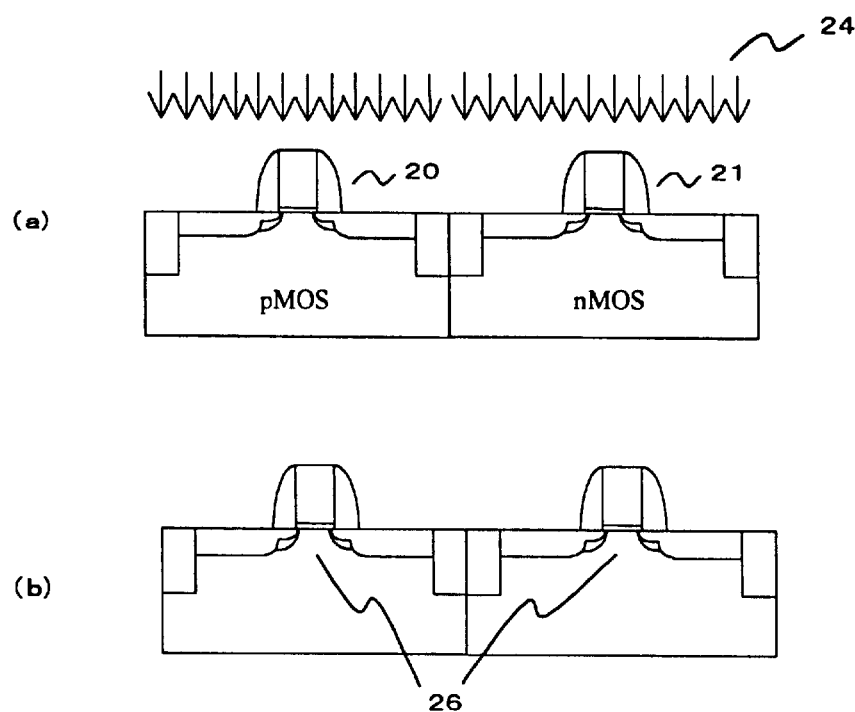
FIGS. 3(a) and 3(b) are a series of schematic cross-sectional views illustrating further steps of the method of manufacturing a semiconductor device in accordance with the present invention.
Figure 4:
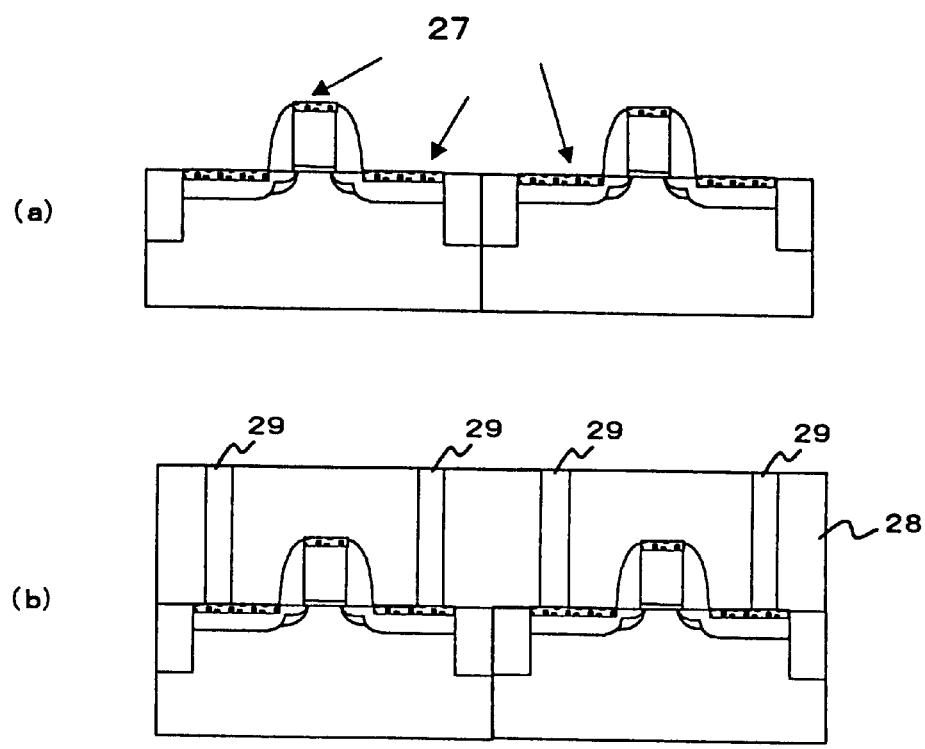
FIGS. 4(a) and 4(b) are a series of schematic cross-sectional views illustrating further steps of the method of manufacturing a semiconductor device in accordance with the present invention.

First, the same steps as illustrated in FIGS. 1–2 of First Example were carried out.

Figure 7:
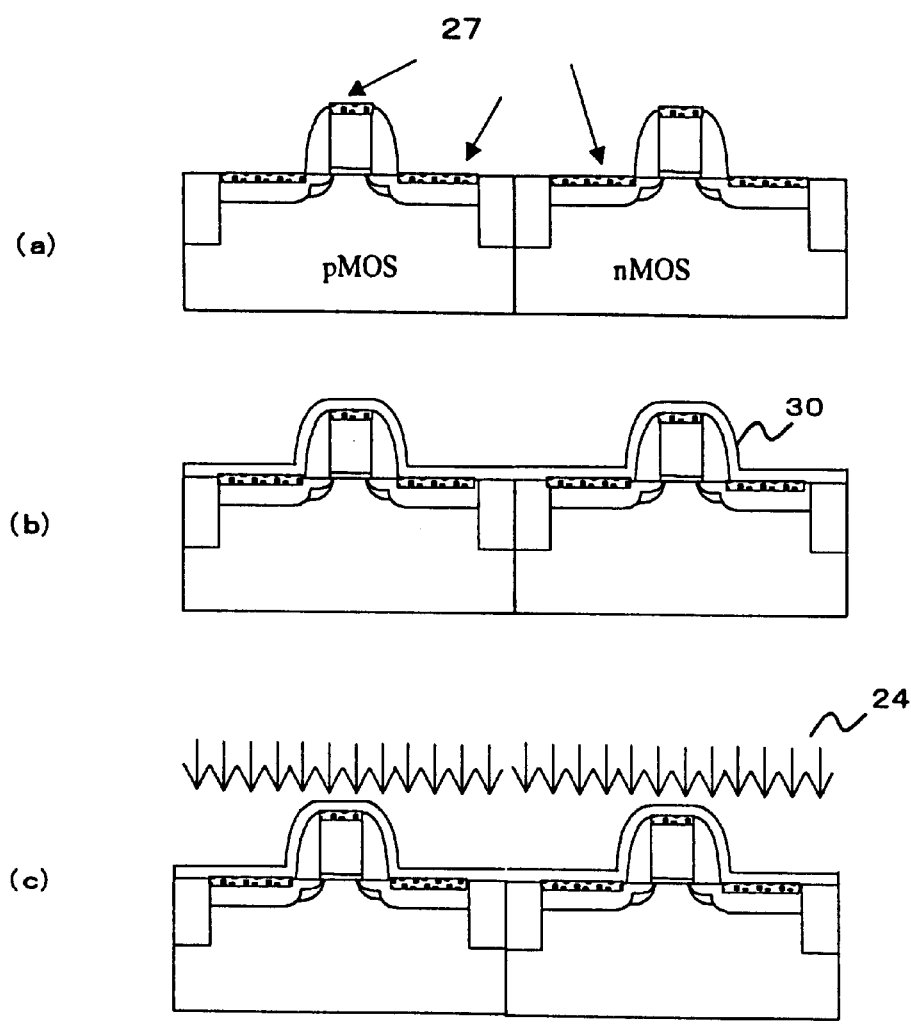
FIGS. 7(a)–7(c) are a series of schematic cross-sectional views illustrating the steps of another method of manufacturing a semiconductor device in accordance with the present invention.

Next, after a cobalt film was formed by the sputtering method, cobalt silicide 27 was formed by applying a heat treatment (FIG. 7(a)). The film thickness of cobalt silicide 27 was approximately 35 nm.

Next, a silicon nitride film 30 (with a film thickness of 50 nm) was formed over the entire surface by the LP-CVD method (FIG. 7(b)). The growth temperature was set to be 630° C.

Next, as shown in FIG. 7(c), the entire surface was subjected to the ion implantation of fluorine 24. The implantation conditions were that the acceleration voltage was 10 keV and the dose was $5\times10^{14}$ cm$^{-2}$. No heat treatment was performed after do-ping fluorine.

Figure 8:
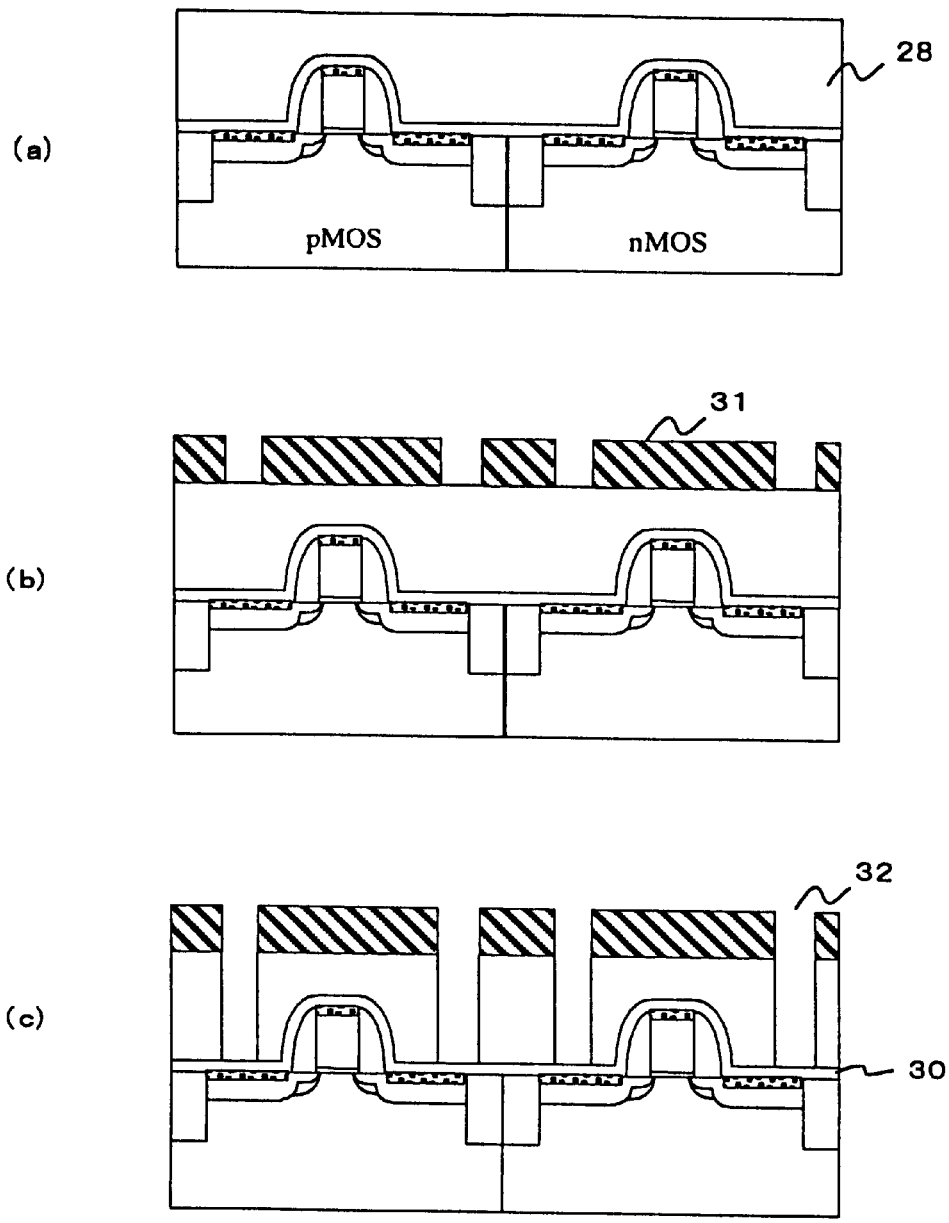
FIGS. 8(a)–8(c) are a series of schematic cross-sectional views illustrating further steps of the method of manufacturing a semiconductor device in accordance with the present invention.

Next, after a BPSG film 28 was formed over the entire surface as an interlayer insulating film (FIG. 8(a)), a resist mask 31 was set thereon (FIG. 8(b)) and then contact holes 32 were formed (FIG. 8(c)). The dry etching was carried out, using an etching gas in which CO, Ar and $O_2$ were added to $C_4F_8$. Since this etching gas has a high etching selection ratio of the silicon oxide film to the silicon nitride film, a silicon oxide film could be etched selectively. Because of this, etching of the BPSG film 28 shown in FIG. 8(c) was stopped above the silicon nitride film 30. The film thickness of the BPSG film was 100 nm or so and considerably thick so that a certain amount of over-etching was necessary in carrying out the above etching. As a result, there were, hitherto, some occasions on which the dopant diffusion layers were also etched and, due to this, a faulty formation of contact plugs was brought about. Against this, in the present invention, a silicon nitride film was set as an etching stopper film so that problems of this sort could be avoided.

Figure 9:
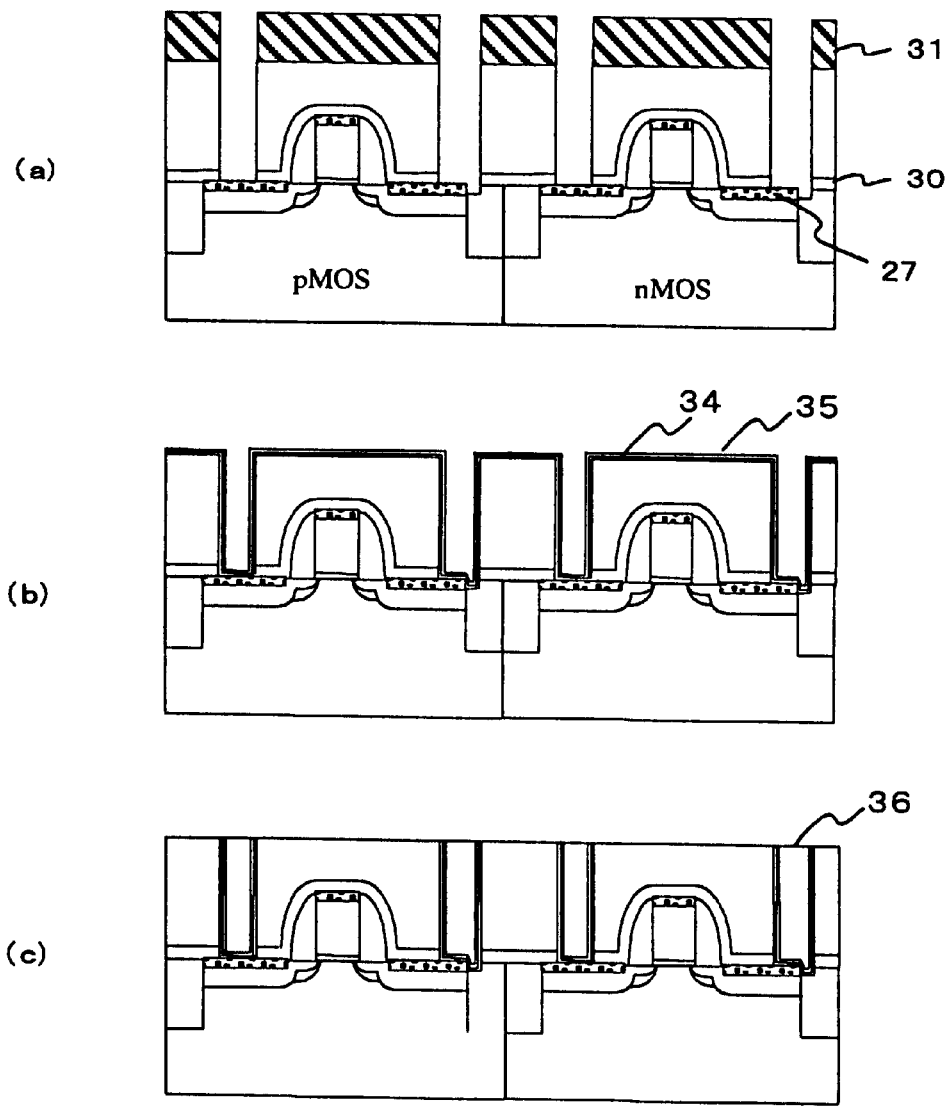
FIGS. 9(a)–9(c) are a series of schematic cross-sectional views illustrating further steps of the method of manufacturing a semiconductor device in accordance with the present invention.

After the BPSG film 28 was etched, the silicon nitride film 30 was then removed by dry etching. The etching gas used hereat was a gas containing $CHF_3$ and $O_2$. Since this etching gas etches the silicon nitride film 30 selectively over the cobalt silicide 27, the above-mentioned dry etching was stopped above the cobalt silicide 27 (FIG. 9(a)). Without this cobalt silicide 27, the source-drain regions may be etched, which may cause the leakage of the current.

After the etching was completed, the resist mask 31 was removed and, then, a Ti film 34 (with a film thickness of 10 nm) and a TiN film 35 (with a film thickness of 50 nm) were formed, in this order. After that, in a nitrogen atmosphere, an annealing treatment was conducted by the RTA method at 690° C. for 30 seconds. At this, doped fluorine diffused within the gate electrode and reached the channel regions 26 lying directly under the gate insulating films 7. Accordingly, the Si—H bonds and the dangling bonds of silicon constituting the channel regions 26 were substituted by fluorine atoms efficiently.

Subsequently, after tungsten 36 was deposited over the entire surface by the sputtering method, tungsten plugs were formed by means of well-known CMP. After that, upper layer interconnections and the like were formed by a well-known method, and thereby a CMOS was accomplished.

For a pMOS included in a CMOS manufactured in the above method, an evaluation of characteristics of the negative bias temperature instability effect resistance was made. The evaluated FETs are summarized in Table 2. Sample No. 1 is a pMOS manufactured in the above method. In addition, other pMOSs into which no fluorine was doped were also evaluated (Samples Nos. 2, 3). Sample No. 2 is a conventional CMOS obtained by a method in which no silicon nitride film was formed and similar to Sample No. 4 in Table 1. Sample No. 3 is a CMOS obtained by a method in which a silicon nitride film was formed and manufactured in the same way as Sample No. 1 except that the step of doping fluorine shown in FIG. 7(c) was not performed.

TABLE 2

| NO. | Dose of the fluorine doping ($cm^{-2}$) | Acceleration voltage at the time of fluorine doping (keV) | SiN deposition |
|---|---|---|---|
| 1 | $5 \times 10^{14}$ | 10 | Yes |
| 2 | None | — | No |
| 3 | None | — | Yes |

Figure 10:
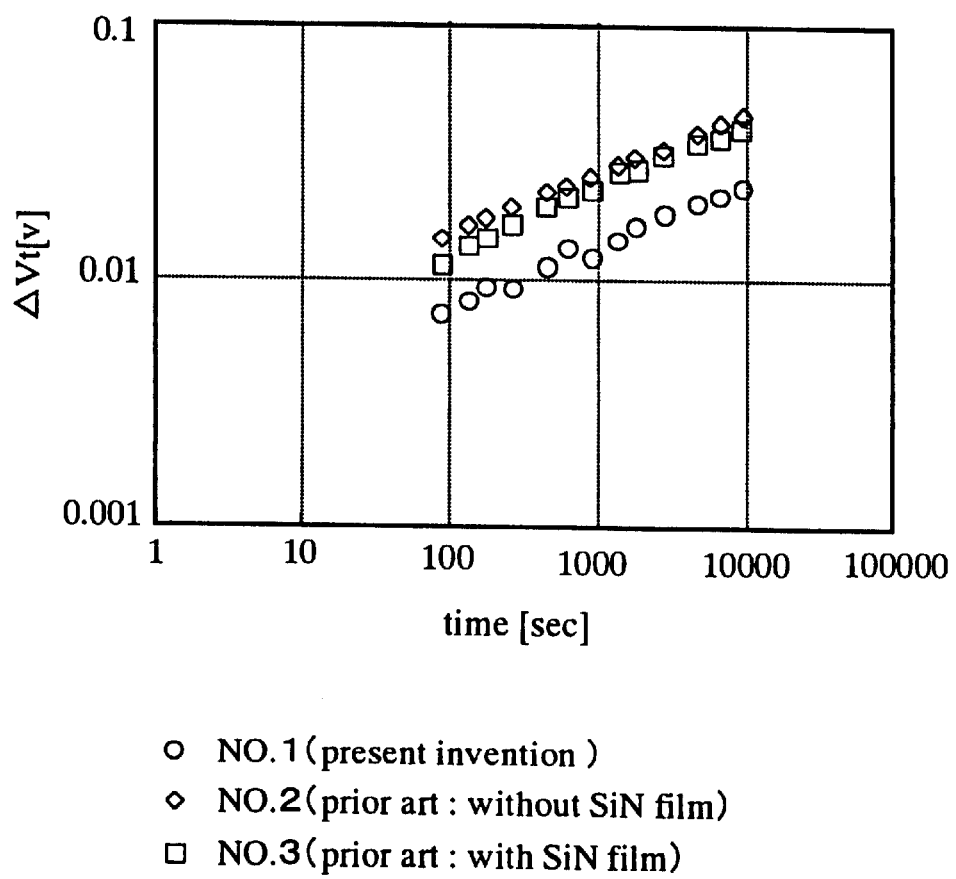
FIG. 10 is a graph in explaining the effect of the negative bias temperature instability effect improvement obtained under the application of the present invention.

The evaluation was made by measuring changes in the threshold voltage while samples were left in an atmosphere at 200° C. When left at such a high temperature, dangling bonds are liable to be generated within the gate insulating film and the channel regions. When this happens, the generation of the negative bias temperature instability effect is accelerated and the change in the threshold voltage, increased. In other words, the evaluation method of the present Example corresponds to an accelerated test of characteristics of the negative bias temperature instability effect resistance. The evaluation results are set out in FIG. 10. It is clearly seen that Sample No. 1 manufactured by the method of the present invention show a smaller change in the threshold voltage than Samples Nos. 2–3, which indicates the negative bias temperature instability effect was well suppressed in Sample No. 1. Furthermore, in comparison with the manufacturing process of First Example, this process of the present Example can reduce the amount of the fluorine doping and besides, it has an advantage that the heat treatment after the fluorine doping can be also used as a heat treatment of another step thereof (In the present Example, it was used as a heat treatment of the annealing step after the Ti/TiN films were formed).

The above description shows that the present Example can improve characteristics of the negative bias temperature instability effect resistance in the pMOS of the CMOS. For the nMOS, the present Example also has the effect of suppressing the change in the threshold voltage due to hot electrons, though not shown.

Further, in the above Examples, the present invention is described, using a process of forming a CMOS, but it is to be understood that the present invention can be applied to the transistor formation in other devices such as a DRAM (Dynamic Random Access Memory).

As described above, in the present invention, after the formation of a source-drain region, the ion implantation with fluorine is carried out and, then, a heat treatment is conducted so that the terminal sections of silicon in the channel regions are efficiently substituted by fluorine atoms. This can suppress the negative bias temperature instability effect and improve the long-term reliability of the transistor. Further, this can effectively prevent the change in the threshold voltage and the degradation of the mutual conductance $g_m$ due to the hot electron effect.

This application is based on Japanese patent application NO.HEI11-070723, the content of which is incorporated hereinto by reference.

What is claimed is:

1. A method of manufacturing a semiconductor device which comprises:

forming a gate electrode over a gate insulating film on a silicon substrate;

introducing dopants of a predetermined conductive-type into said gate electrode and a surface of said silicon substrate;

after said introducing dopants, carrying out a first heat treatment so as to make said dopants within said substrate diffuse and form a source-drain region; and after forming said source-drain region, doping fluorine, at least into said gate electrode and thereafter carrying out a second heat treatment so as to make fluorine diffuse into a channel region of said silicon substrate.

2. The method of manufacturing a semiconductor device according to claim 1, wherein said dopants comprise boron.

3. The method of manufacturing a semiconductor device according to claim 1, wherein said dopants comprise arsenic, phosphorus or antimony.

4. The method of manufacturing a semiconductor device according to claim 1, wherein said doping of fluorine into said gate electrode is carried out by ion implantation at a dose of $1 \times 10^{13}$ $cm^{-2}$ to $1 \times 10^{16}$ $cm^{-2}$.

5. The method of manufacturing a semiconductor device according to claim 1, wherein said second heat treatment is carried out at a treatment temperature of 500 to 900° C.

6. A method of manufacturing a semiconductor device which comprises:

forming a gate electrode over a gate insulating film on a silicon substrate;

introducing dopants of a given conductive-type into said gate electrode and a surface of said silicon substrate;

carrying out a first heat treatment so as to make said dopants within said silicon substrate diffuse and form a source-drain region;

after forming said source-drain region, forming a silicon nitride film over an entire surface of said semiconductor device;

after forming said silicon nitride film, doping fluorine, at least, into said gate electrode and thereafter carrying out a second heat treatment so as to make said fluorine diffuse into a channel region of said silicon substrate.

7. The method of manufacturing a semiconductor device according to claim 6, wherein said dopants comprise boron.

8. The method of manufacturing a semiconductor device according to claim 6, wherein said dopants comprise arsenic, phosphorus or antimony.

9. The method of manufacturing of a semiconductor device according to claim 6, wherein said doping of fluorine into said gate electrode is carried out by ion implantation at a dose of $1\times10^{13}$ cm$^{-2}$ to $1\times10^{16}$ cm$^{-2}$.

10. The method of manufacturing a semiconductor device according to claim 6, wherein said second heat treatment was carried out at a treatment temperature of 500 to 900° C.

11. The method of manufacturing a semiconductor device according to claim 1, wherein a threshold voltage and drain saturation current are substantially constant over time.

12. The method of manufacturing a semiconductor device according to claim 6, wherein a threshold voltage and drain saturation current are substantially constant over time.

* * * * *